United States Patent [19]

Myers et al.

[11] Patent Number: 5,736,903
[45] Date of Patent: Apr. 7, 1998

[54] CARRIER BUFFER HAVING CURRENT-CONTROLLED TRACKING FILTER FOR SPURIOUS SIGNAL SUPPRESSION

[75] Inventors: Brent A. Myers; Scott G. Bardsley, both of Palm Bay, Fla.

[73] Assignee: Harris Corporation, Melbourne, Fla.

[21] Appl. No.: 637,140

[22] Filed: Apr. 24, 1996

[51] Int. Cl.⁶ .................... H03L 7/093; H03L 7/16
[52] U.S. Cl. .................. 331/17; 331/8; 327/156; 332/127; 375/376
[58] Field of Search .................. 331/8, 17, 34; 327/156–159; 332/127; 375/344, 376

[56] References Cited

U.S. PATENT DOCUMENTS 5,512,861  4/1996  Sharma .................. 331/74

*Primary Examiner*—David Mis
*Attorney, Agent, or Firm*—Charles E. Wands

[57] ABSTRACT

Spurious energy suppression for a data communication system is achieved without using a large order noise suppression filter, by means of a pre-mixer tracking filter incorporated into an emitter-coupled logic configured buffer of a carrier frequency generator, using a MOSFET-implemented current-controlled resistance component of a resistor-capacitor network and an associated current control stage. The MOSFET-implemented resistance components of the filter are controlled by the same control current that establishes the carrier generator's output frequency. As a result, the cut-off frequency of the tracking filter is linearly proportional to the carrier and effectively independent of process parameters.

16 Claims, 1 Drawing Sheet

5,736,903

CARRIER BUFFER HAVING CURRENT-CONTROLLED TRACKING FILTER FOR SPURIOUS SIGNAL SUPPRESSION

FIELD OF THE INVENTION

The present invention relates in general to communication circuits, and is particularly directed to an improved carrier generator incorporating a pre-mixer 'carrier-tracking' filter circuit, having a cut-off frequency that varies linearly with a control current supplied to a current-controlled oscillator, from which a drive signal for producing the carrier frequency to be tracked is derived.

BACKGROUND OF THE INVENTION

One of the requirements currently imposed (by the FCC) upon communication systems and networks is that they comply with very stringent spurious energy suppression standards. In today's digital communications environment, data signals (which have square rather than sinusoidal characteristics) are typically conditioned and modulated upon a higher carrier frequency (e.g., via emitter coupled logic circuitry (ECL)-based in-phase I and quadrature Q channels) where the data can be more readily transmitted.

Since the primary signal energy component of interest is located in the spectrum immediately surrounding the carrier center frequency, other spurious energy—typically the odd harmonics (multiples) of the original carrier frequency resulting from the modulation (multiplication or mixing) operation of such non-sinusoidal signals—must be removed, in order to avoid contaminating adjacent carrier channels that contain their own information energy components.

One way to remove such spurious energy is to apply the mixer output to a lowpass filter having a cutoff frequency that is slightly higher than the highest carrier frequency to be employed in a given communication system, such as a frequency-agile transceiver. Unfortunately, if the highest carrier frequency capable of being generated is close to the second or third harmonic of the lowest carrier frequency in the operating range of the system, the size (order) of the filter required to achieve sufficient unwanted energy suppression under all operating conditions is unacceptably large.

As a non-limiting example, in the case of conducting data communications over a television cable network, the required harmonic suppression filter may be an eight to twelve order filter. Such a large and complex filter is obviously impractical where cost and semiconductor area are prime considerations in chip design. Moreover, such a large order filter has a higher group delay error, which can increase bit error rate.

Another technique is to add a filter pole to the carrier generator prior to the mixer. For a fixed carrier, adding a single pole is readily accomplished by simply adding a capacitor; however, in the case of a frequency-agile system, it is necessary to employ a plurality of capacitors, typically implemented as a programmable (controllably switched, binary weighted) capacitor array.

If the process employed to manufacture the integrated circuit architecture is a BiMOS process, MOSFET switches may be used to switch among the capacitors of the array. However, for a multiple channel system where there are a considerable number of potential carrier frequencies—requiring a separate capacitor for each carrier frequency, a binary-weighted capacitor array cannot be effectively employed, since the filter's cutoff frequency varies with the reciprocal of the value of the capacitor. As a consequence, if the cutoff frequency is to vary in a linear manner, the cutoff control capacitor must vary in a non-linear fashion, which not only again leads to an unacceptably large and complex filter, but the required switch array introduces parasitic poles, which are not readily compensated.

SUMMARY OF THE INVENTION

In accordance with the present invention, the shortcomings of each of the filter proposals described above are successfully remedied by configuring a carrier generator buffer (an emitter-coupled logic configured buffer) to include a MOSFET-implemented current-controlled resistance as the resistor component of a resistor-capacitor network of a tracking filter of the carrier generator. The controlled resistance is coupled to an associated current control stage, that is coupled in a PLL servo loop, so that the MOSFET-implemented resistance component is controlled by the same control current that establishes the operating frequency of the carrier generator.

Pursuant to an exemplary embodiment of the invention, a carrier buffer for a quadrature modulator is configured as an emitter coupled logic buffer formed of a matched differential transistor pair of bipolar transistors. The buffer transistors have their collectors coupled to controlled MOSFET resistors, which are operated in the linear portion of their $V_{DS}$-$I_{DS}$ characteristic. The respective base electrodes of the carrier generator's buffer transistor pair receive complementary square wave drive signals from respective outputs of a current-controlled oscillator (ICO) of a controlling phase locked loop (PLL).

The gate electrodes of the respective P-MOSFET resistors are coupled in common to receive a tuning control voltage, derived from the loop filter, which is coupled to the output of the loop's phase detector. The phase detector is coupled to provide an output representative of the phase difference between a reference carrier frequency and the square wave output of the ICO of the PLL.

The P-MOSFET resistors have their source electrodes coupled to the positive supply voltage, while their respective drain electrodes are coupled to the collector electrodes of the buffer bipolar transistors. A lowpass filter cut-off control capacitor is coupled between the collector electrodes of the buffer transistors. The emitters of the buffer transistors are coupled in common to a current mirror circuit, which mirrors an ICO control current for the emitter-coupled multivibrator of the PLL.

A current mirror N-MOSFET has commonly connected drain and gate electrodes connected to the source of a current control N-MOSFET, the drain electrode of which is coupled to the drain electrode of further P-MOSFET current source, and the gate electrode of which is coupled to the output of a differential amplifier. The differential amplifier provides control for establishing the current for tuning the ICO of the PLL circuit, in accordance with the tuning voltage, $V_{TUNE}$, as well as providing a reference output voltage level for the tracking generator at the drains of the P-MOSFET devices.

In order for the cutoff frequency, which is proportional to the reciprocal of the capacitor-resistor product RC of the MOSFET resistor-capacitor tuning network of the emitter-coupled logic configured buffer, to vary in a linear manner, the resistor component (defined by the buffer's MOSFET resistors) is adjusted in a non-linear fashion. The MOSFET resistors and MOSFET control current source are identical devices; hence, the output driver current is a replica of the control current for the ICO. Further, the output voltage level is fixed by virtue of the servo control loop.

For example, if the ICO current increases, so as to increase the oscillator frequency, since the servo loop forces the output level to be fixed, the MOSFET resistance must decrease in order to support the increase in current. The decreased resistance results in a higher cutoff frequency for the RC filter, thus tracking the oscillator frequency.

Because the carrier generator's MOSFET resistors operate in the linear portion of their $V_{DS}$-$I_{DS}$ characteristic, the equivalent resistances of the tunable MOSFET resistors are equal to the ratio of the servo amplifier input reference voltage and the tuning control current. The cutoff frequency $f_o$ of the resulting pole of the emitter-coupled logic configured buffer carrier generator due to the capacitor C and the MOSFET resistors R of its RC tuning network is given by $f_o=1/2\pi RC$. R is inversely proportional to the ICO control current $I_o$, whereby the cutoff frequency $f_o$ is directly proportional to $I_o$. Since the ICO frequency $f_{osc}$ is also directly proportional to $I_o$, the cutoff frequency $f_o$ is proportional to $f_{osc}$; i.e., $f_o \propto f_{osc}$. Under a locked condition, $f_{osc}$ is equal to the desired carrier frequency $f_c$, and hence the cutoff frequency $f_o$ of the filter linearly tracks the carrier frequency.

DETAILED DESCRIPTION

Figure 1:
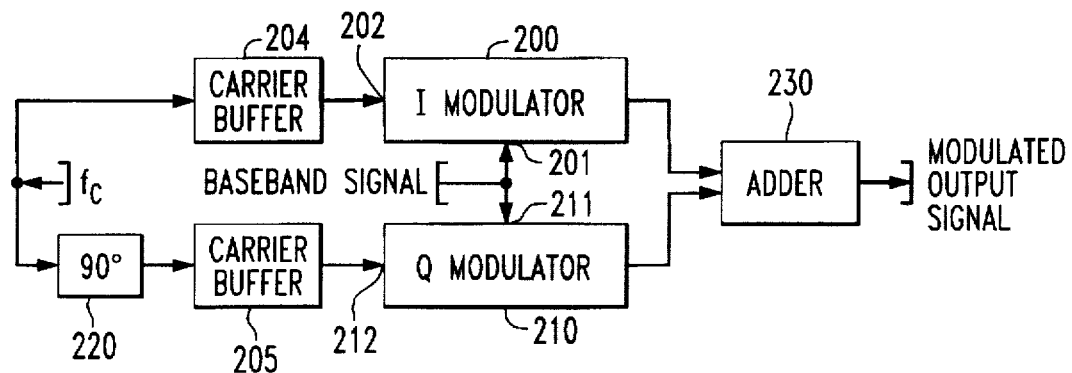
FIG. 1 diagrammatically illustrates the configuration of a quadrature modulator arrangement, which is driven by a current-controlled, emitter-coupled logic configured carrier frequency generator incorporating a linear pre-mixer tracking filter in accordance with the present invention.
Figure 2:
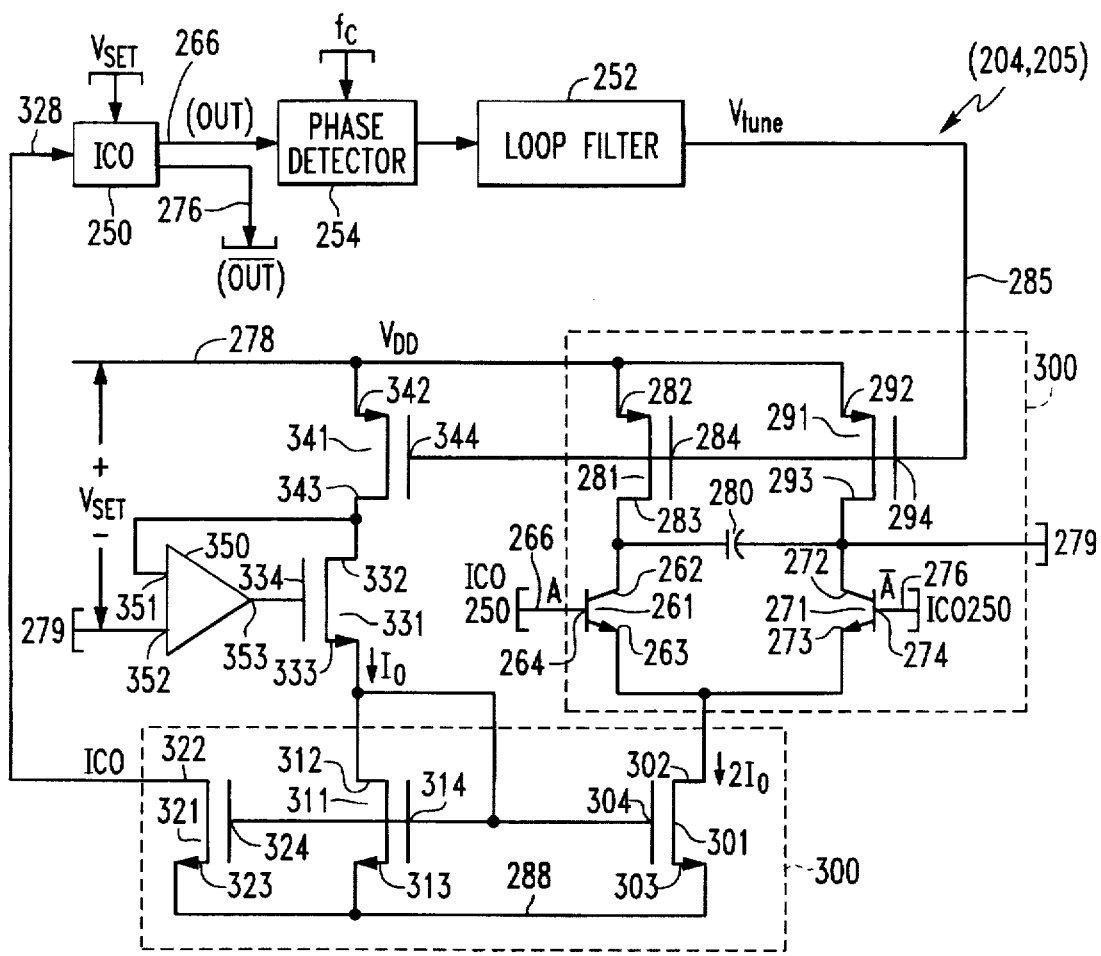
FIG. 2 schematically illustrates the configuration of a current-controlled, emitter-coupled logic configured carrier buffer and an associated interface to a phase locked loop network, which generates an initial carrier signal.

The general configuration of a quadrature carrier modulator arrangement that incorporates a pre-mixer tracking filter mechanism according to the present invention is diagrammatically illustrated in FIG. 1 as comprising an in-phase (I) modulator (mixer/multiplier) stage 200 having a first input 201 to which a baseband signal of interest is applied, and a second input 202, which is coupled to receive a carrier frequency signal supplied from an emitter-coupled square wave carrier buffer 204, schematically shown in detail in FIG. 2, to be described.

The quadrature modulator arrangement of FIG. 1 further includes a quadrature-phase (Q) mixer stage 210 having a first input 211 to which the baseband signal is applied, and a second input 212, which is coupled to receive a quadrature-shifted carrier frequency signal from a second carrier buffer 205, also configured as schematically illustrated in FIG. 2. In a preferred embodiment, the phase locked loop and control current loop may be shared between the two carrier buffers. The outputs of mixer stages 200 and 210 are summed in an adder 230, so as to produce the resultant quadrature modulated output signal.

Referring now to FIG. 2, the architecture of a respective carrier generator 204/205 is schematically illustrated as comprising an emitter coupled logic (ECL) buffer 260, formed of a matched differential transistor pair of a first bipolar (NPN) transistor 261 and a second bipolar (NPN) transistor 271. Bipolar transistors 261 and 271 have their respective collectors 262 and 272 coupled to first and second controlled resistors, shown as MOSFETs 281 and 291, which are operated in the linear portion of their $V_{DS}$-$I_{DS}$ characteristic, and are adjusted in accordance with a resistor tuning voltage $V_{tune}$, as will be described.

The respective base electrodes 264 and 274 of transistors 261 and 271 receive complementary square wave drive signals, shown as A and ABAR, supplied over lines 266 and 276 from respective outputs OUT and OUTBAR of a current-controlled oscillator 250, which may be implemented as an ECL multivibrator circuit, to facilitate circuit fabrication and component matching.

The gate electrodes 284 and 294 of respective MOSFET resistors 281 and 291 are coupled in common to a control voltage lead 285, to which the above-referenced control voltage $V_{tune}$ is applied. The control voltage $V_{tune}$ is derived from an associated phase lock loop (PLL) loop filter 252, which is coupled to the output of a phase detector 254. Phase detector 254 is coupled to provide an output representative of the phase difference between a reference carrier frequency $f_c$ and the square wave A output of current-controlled oscillator 250.

MOSFET resistors 281 and 291 have their source electrodes 282 and 292 coupled to a supply voltage lead 278, while their respective drain electrodes 283 and 293 are coupled to the collector electrodes 262 and 272 of bipolar transistors 261 and 271, respectively. A lowpass filter cut-off control capacitor 280 of the carrier generator 204 is coupled between the collector electrodes 262 and 272 of transistors 261 and 271. The respective emitters 263 and 273 of transistors 261 and 271 are coupled in common to the source electrode 302 of a MOSFET 301 of a current mirror circuit 300.

MOSFET 301 of current mirror 300 has its source electrode 303 coupled to a reference supply rail 288 and its gate electrode 304 coupled in common to the drain electrode 312 and gate electrode 314 of a current mirror MOSFET 311. The drain electrode 302 of MOSFET 301, to which the commonly coupled emitters 263 and 273 of transistors 261 and 271 are connected, scales the current $I_o$ supplied through a control loop N-MOSFET 331 to $2I_o$. A further current mirror MOSFET 321 has its source electrode 323 coupled to supply rail 288, its gate 324 coupled to the gate electrodes 304 and 314 of current mirror N-MOSFETs 301 and 311, respectively, and its drain electrode 322 coupled to provide a control current $I_o$ over link 328 to ICO 250.

Current mirror N-MOSFET 311 has commonly connected drain and gate electrodes 312, 314 connected to the source electrode 333 of N-MOSFET 331. The drain electrode 332 of MOSFET 331 is coupled to the drain electrode 343 of a controlled P-MOSFET resistor 341, and the gate electrode 334 of MOSFET 331 is coupled to the output 353 of a differential amplifier 350 which, together with N-MOSFET 331, provides a servo loop control current for establishing the control current $I_o$ for tuning the ICO, in accordance with the above-referenced tuning voltage $V_{tune}$, as will be described.

Differential amplifier 350 has a first input 351 coupled to the node between the drain electrode 343 of P-MOSFET resistor 341 and the drain of N-MOSFET 331. Differential amplifier 350 has a second input 352 coupled to a voltage lead 279 to which a voltage reference ($-V_{set}$ with respect to the positive supply rail) is applied. The gate electrode 344 of MOSFET resistor 341 is coupled to control lead 285, and its source electrode 342 is coupled to the supply voltage lead 278.

As described previously, in order for the filter cutoff frequency of the carrier generator 204, which is inversely proportional to the capacitor-resistor product, to vary in a linear manner, the resistor component of the ECL buffer's RC tuning component is adjusted in a non-linear fashion.

As described in the text: "Bipolar and MOS Analog I.C. Design," by Alan B. Grebene, p. 570, Wiley Publ. 1984, for an ICO realized as an emitter coupled multivibrator having an input control current $I_o$, its operating frequency $f_{osc}$ may be given by the expression:

$$f_{osc} = I_o/4V_{set}C_o, \quad (1)$$

where $V_{set}$ is an internal reference voltage corresponding to that applied to the carrier buffer, and $C_o$ is the value of the frequency-setting capacitor of the multivibrator.

In the integrated circuit diagram of FIG. 2, P-MOSFET resistors 281, 291 and 341 are identical devices, so that the output driver current $I_o$ is a replica of the current flowing through P-MOSFET resistor 341. The servo loop comprised of amplifier 350 and MOSFET 331 assures that the drain voltage of P-MOSFET resistor 341 with respect to $V_{DD}$ is equal to $V_{set}$. Since the MOSFET resistors are identical, the drain voltages of MOSFET resistors 281 and 291 are also equal to $V_{set}$.

Letting $R_{281}$ and $R_{291}$ be the equivalent resistances of MOSFET resistors 281 and 291, and assuming that they operate in the linear portion of their $V_{DS}$-$I_{DS}$ characteristic, then the equivalent resistances of MOSFET resistors 281 and 291 are respectively given by:

$$R_{281} = R_{291} = V_{set}/I_o \quad (2)$$

By combining equations (1) and (2), $R_{281}$ and $R_{291}$ can be defined as:

$$R_{281} = R_{291} = 1/4f_{osc}C_o \quad (3)$$

The cutoff frequency $f_o$ of the resulting pole of the ECL carrier generator 204 due to $C_{280}$ and $R_{281}$ (or $R_{291}$) is defined as:

$$f_o = 1/(4\pi R_{281}C_{280}) \quad (4)$$

so that, from equations (3) and (4), $f_o$ can be defined as:

$$f_o = 4f_{osc}C_o/2\pi C_{280} \quad (5)$$

Since, under a locked condition of the frequency synthesizer's PLL, the frequency $f_{osc}$ is equal to the desired carrier frequency $f_c$, the cutoff frequency $f_o$ of the filter mechanism that is incorporated into the ECL carrier generator tracks the carrier frequency.

From the foregoing description, it can be seen that the impracticality of attempting to implement a spurious energy suppression filter as an unacceptably large order noise suppression filter for a data communication system can be readily simplified by incorporating a pre-mixer tracking filter into an ECL-configured buffer using a MOSFET-implemented current-controlled resistance component of a resistor-capacitor network and an associated current control stage, with the MOSFET-implemented resistance components of the filter being controlled by the same control current that establishes the carrier frequency. As a result, the cut-off frequency of the filter effectively tracks the carrier.

While we have shown and described an embodiment in accordance with the present invention, it is to be understood that the same is not limited thereto but is susceptible to numerous changes and modifications as known to a person skilled in the art, and we therefore do not wish to be limited to the details shown and described herein but intend to cover all such changes and modifications as are obvious to one of ordinary skill in the art.

What is claimed:

1. A carrier frequency generator for a communication device having a frequency synthesizer employing a current-controlled oscillator, which generates an output frequency in accordance with a control current therefor, said frequency synthesizer having a phase locked loop containing said current-controlled oscillator, said carrier generator being driven by said frequency synthesizer and including a tunable tracking filter stage, operational characteristics of which are controllable in accordance with said control current, such that said tunable filter stage has a cut-off frequency that is linearly proportional to said control current, whereby said frequency of the tracking filter effectively tracks said carrier frequency.

2. A carrier frequency generator according to claim 1, wherein said current-controlled oscillator is operative to produce said output frequency in linear proportion to said control current, and including an emitter-coupled logic configured multivibrator, which is operative to generate said output frequency in linear proportion to said control current.

3. A carrier frequency generator according to claim 1, wherein said carrier generator comprises a buffer circuit containing differential transistor pair having a non-linear tunable resistor of a resistor-capacitor network as said tunable filter stage.

4. A carrier frequency generator according to claim 3, wherein said buffer comprises a matched differential bipolar transistor pair, having respective collectors coupled to MOSFET-implemented resistors, which are operated in the linear portion of their $V_{DS}$-$I_{DS}$ characteristic.

5. A carrier frequency generator according to claim 4, wherein the resistance values of said MOSFET-implemented resistors are controlled in accordance with the output of a differential amplifier which provides a control current servo loop for tuning said current controlled oscillator via a control current derived in accordance with a tuning voltage of said phase locked loop.

6. A method of controlling the cutoff frequency of a carrier frequency generator having its operational frequency defined in accordance with a resistor-capacitor network thereof comprising the steps of:

(a) configuring a resistance component of said resistor-capacitor network as a tunable resistance which varies non-linearly with a control current; and (b) controlling the value of said tunable resistance in accordance with said control current.

7. A method according to claim 6, wherein said carrier frequency generator includes a transistor buffer formed of a matched differential bipolar transistor pair, having respective collectors thereof coupled to MOSFET-implemented resistors, which are operated in the linear portion of their $V_{DS}$-$I_{DS}$ characteristic.

8. A method according to claim 7, wherein the resistance values of said MOSFET-implemented resistors are controlled in accordance with the output of a differential amplifier which provides a control current servo loop for tuning a current controlled oscillator which supplies input frequency drive signals to said buffer, said control current being derived in accordance with a tuning voltage of a phase locked loop for said oscillator.

9. A carrier frequency generator comprising an emitter-coupled logic configured buffer formed of a matched differential bipolar transistor pair having their collectors coupled to controlled MOSFET resistors of a resistor-capacitor tuning network, their base electrodes coupled to receive complementary square wave drive signals from a controlled oscillator of a phase locked loop, and their emitter electrodes coupled to a current control loop, and wherein said MOSFET resistors are controlled by a control current that establishes the output frequency of said controlled oscillator.

10. A carrier frequency generator according to claim 9, wherein gate electrodes of said MOSFET resistors are coupled in common to receive a tuning control voltage, derived from an associated phase lock loop filter, which is coupled to the output of a phase detector providing an output representative of the phase difference between a reference carrier frequency and the square wave output of said controlled oscillator.

11. A carrier frequency generator according to claim 10, wherein said MOSFET resistors have their source electrodes coupled to receive first polarity of an oscillator control voltage, and respective drain electrodes thereof are coupled to collector electrodes of said transistor pair of said buffer.

12. A carrier frequency generator according to claim 11, wherein emitters of said buffer transistors are coupled in common to a current mirror circuit, which mirrors a control current for said controlled oscillator.

13. A carrier frequency generator according to claim 12, wherein said current control loop includes a differential amplifier that provides a servo loop control current for establishing the control current for tuning said controlled oscillator in accordance with said tuning control voltage.

14. A carrier frequency generator according to claim 13, wherein said MOSFET resistors are varied in a non-linear fashion by said tuning voltage, so that said buffer has a cutoff frequency which varies in an inverse linear manner with the capacitor-resistor product RC of the MOSFET resistor-capacitor tuning network.

15. A carrier frequency generator according to claim 14, wherein said MOSFET resistors of said buffer operate in the linear portion of their $V_{DS}$-$I_{DS}$ characteristic, so that equivalent resistances of said MOSFET resistors are equal to the ratio of the control voltage for said controlled oscillator and said control current.

16. A carrier frequency generator according to claim 15, wherein the cutoff frequency $f_o$ of the resulting pole of said buffer resulting from said capacitor and said MOSFET resistors is defined as $f_o = 1/2\pi RC$, so that $f_o$ is proportional to $f_{osc} C_0/C$, whereby under a locked condition of said phase locked loop, said cutoff frequency $f_o$ tracks the carrier frequency $f_{osc}$.

\* \* \* \* \*